United States Patent [19]

Rieder

[11] Patent Number: 5,432,826
[45] Date of Patent: Jul. 11, 1995

[54] DIGITAL PHASE COMPARATOR AND PHASE-LOCKED LOOP

[75] Inventor: Klaus-Hartwig Rieder, Stuttgart, Germany

[73] Assignee: Alcatel N.V., Amsterdam, Netherlands

[21] Appl. No.: 115,411

[22] Filed: Aug. 31, 1993

[30] Foreign Application Priority Data

Sep. 1, 1992 [DE] Germany .................. 42 29 148.8

[51] Int. Cl.⁶ ............................................ H04L 7/00
[52] U.S. Cl. .................................. 375/371; 375/376; 327/12; 327/159
[58] Field of Search .............. 375/110, 188, 119, 120; 307/510, 511, 525, 269; 328/63, 109, 139, 133, 72

[56] References Cited

U.S. PATENT DOCUMENTS

| | | | |
|---|---|---|---|
| 3,989,931 | 11/1976 | Phillips | 377/43 |
| 4,743,857 | 5/1988 | Childers | 375/120 |
| 4,829,545 | 5/1989 | Guzik et al. | 375/120 |
| 4,837,781 | 6/1989 | Hickling | 375/120 |
| 4,984,255 | 1/1991 | Davis et al. | 375/110 |
| 5,087,828 | 1/1992 | Sato et al. | 307/269 |

FOREIGN PATENT DOCUMENTS 4025307 2/1992 Germany .
9003693 5/1990 WIPO .

OTHER PUBLICATIONS

Patent Abstracts of Japan, vol. 4, No. 148 (E-030) 18 Oct. 1980 & JP-A-55 100 739 (Mitubishi Electric Corp) Jul. 1980.
Proceedings of the IEEE, Bd. 72, Nr. 3, Mar. 1984, New York US Seiten 397-398, T. S. Rathore et al. "An Accurate Digital Phase Measurement Scheme".
"Semiconductor Circuit Technology", 8th Issue, Springer Publishers 1986, p. 247.

Primary Examiner—Stephen Chin
Assistant Examiner—Tesfaldet Bocure
Attorney, Agent, or Firm—Ware, Fressola, Van der Sluys & Adolphson

[57] ABSTRACT

A digital phase comparator measures the phase difference of two signals (S1, S3) from a third signal (S2), and calculates the difference. The zero crossing of the two signals respectively sets two flip-flops (11, 12). If both flip-flops are set, they are simultaneously reset with a delay. Each set flip-flop enables a corresponding counter (13, 14). An evaluation unit averages the counter outputs at major intervals. The phase comparator can be incorporated into a phase-locked loop.

8 Claims, 2 Drawing Sheets

DIGITAL PHASE COMPARATOR AND PHASE-LOCKED LOOP

TECHNICAL FIELD

The invention concerns a phase comparator and a phase-locked loop incorporating a digital phase comparator.

BACKGROUND OF THE INVENTION

Such a phase comparator is known from DE 40 25 307 A1. In principle, the distance in time is measured between two equal-phase points of the signals being compared. The phase difference of the passage through zero is determined from the thus assumed analog signals. The slopes are the reference points when digital signals are being compared. If rising zero passages or slopes of one signal are compared with falling zero passages or slopes of the other signal, 180 degrees must be added to the obtained phase difference, which may be desirable for many applications. With the known comparator, a gate is opened by a signal whose reference phase occurs first; the other signal closes the gate. A counter counts the intermediate pulses of a timer. In the known example, the time pulse is coupled to one of the two signals that acts as reference signal in such a way, that its frequency is an integral multiple of the reference signal's frequency. For example, when the frequency of the timer is 360 times that of the reference signal frequency, the counted pulses directly provide the phase difference in degrees.

With the known comparator, the smallest measurable phase difference is one degree. A finer resolution can only be achieved by increasing the pulse frequency of the time pulse. However, it has relatively narrow limits. Furthermore, with the known comparator there is the problem of coincidence suppression of small phase differences, which also prevents measuring the smallest differences.

SUMMARY OF THE INVENTION

The invention has the task of creating a phase comparator, which can also satisfactorily detect small phase differences, and a phase-locked loop that satisfactorily corrects small phase differences as well. The task is fulfilled by a digital phase comparator comprising a first flip-flop which is settable by a given phase transition of a first signal and resettable by a given phase transition of a second signal, and a first counter which is enabled by the flip-flop as long as the latter is set, and whose clock input is supplied with a clock signal whose frequency is high compared with the frequencies of the first signal and the second signal; and wherein the phase comparator further comprises a second flip-flop which is settable by a given phase transition of a third signal and is resettable together with the first flip-flop, a second counter which is enabled by the second flip-flop as long as the latter is set, and whose clock input is supplied with the clock signal, and an evaluation unit which forms a reference value for the phase difference between the first signal and the third signal by calculating the difference between the counts of the two counters, and where the second signal is an auxiliary signal whose frequency is approximately equal to the frequency of the first signal and the third signal.

The invention is also directed to a phase-locked loop incorporating such a phase comparator.

The use of two equal branches with subsequent difference formation to solve the problem of coincidence suppression for bidirectional counters is known from U. Tietze, Ch. Schenk, Semiconductor Circuit Technology, 8th. issue, Springer Publishers 1986, p. 247. Since the two counters are released by one of the two signals being compared, but are then jointly blocked by an auxiliary signal, it ensures that the measuring periods of the counters are long enough to detect counter time pulses. The fact that the counters respond to counter time pulses is an important premise for them to count many different pulses with small phase differences, at least occasionally.

As a rule, phase comparators are a component of a phase-locked loop, which controls the phase of a signal in such a way, that it has a specified reference to the phase of a reference signal. Phase-locked loops usually also contain an element with a time-smoothing effect, a low pass filter in the analog case. This averaging process can be taken into account when the phase comparator is constructed. It is therefore sufficient if small phase differences are only occasionally noticeable during the measurement. However, it is generally known that an increase in the measurement accuracy can only be achieved with repeated measurements and subsequent averaging, if systematic measurement errors are avoided. The separate measurement of the phase difference of the two signals by comparison to a third signal, and the formation of a difference by it, produces a certain recoupling, which serves to avoid systematic errors.

In the simplest of cases, the auxiliary signal can be obtained from the two signals being compared.

If the frequency of the time pulse is not an integral multiple of the frequency of the signals being compared, a further strong decoupling takes place between the phase comparator as the measuring device, and the signals as the measured object. This strong de, coupling results in a sharp reduction of systematic measurement errors.

The averaging process can take place in simple form in the phase comparator itself, in conjunction with the difference formation, which is required anyway, for example if a difference can only be formed after a number of measurement cycles.

BRIEF DESCRIPTION OF THE DRAWINGS

In the following, the invention will be further explained by means of a configuration example and the attached drawings, where.

BEST MODE FOR CARRYING OUT THE INVENTION

Figure 1:
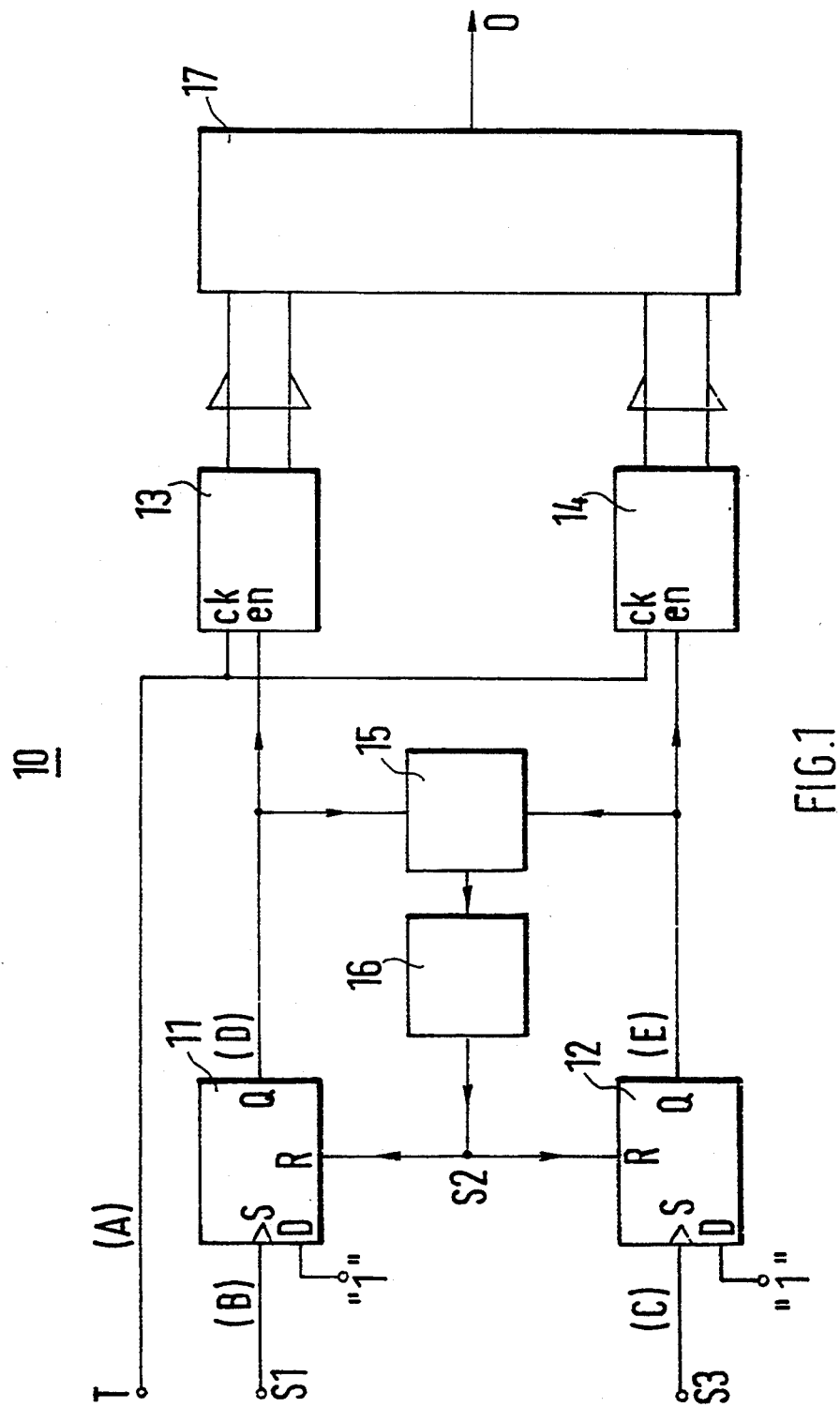
FIG. 1 is a block circuit diagram of a phase comparator according to the invention.

The phase comparator 10 in FIG. 1 features two bistable flip-flops, namely a flip-flop 11 and a flip-flop 12, two counters 13 and 14, a logic circuit consisting of an AND-gate 15 and a delay stage 16, and an evaluation unit 17.

Each of the two flip-flops 11 and 12 has a data input D, a clock input T, a reset input R and an outlet Q. Each of the counters 13 and 14 has a clock input ck and a release input en. The parallel data outputs of the counters are indicated by a bus running from each counter to the evaluation unit 17. Although the buses are provided with directional arrows, reset lines running in the opposite direction must not be excluded.

The signals S1 and S3, which are being compared with respect to their phase, are located at the clock inputs S of flip-flops 11 or 12. The data inputs D of both flip-flops are always connected to the level that corresponds to the logic value "1". The clock inputs S then operate like dynamic setting inputs. The setting inputs corresponding to the reset inputs R are not switched, or are only switched so that they have no effect. The outputs Q of the flip-flops are connected to the release inputs of counters 13 or 14, so that a set flip-flop releases the corresponding counter, and a not set flip-flop blocks the corresponding counter. A time pulse T is located at the clock inputs ck of counters 13 and 14. The frequency of time pulse T should be high with respect to the frequency of the two signals S1 and S3 being compared. (A phase comparison between two signals presupposes that at least their nominal frequency is equal.) The greater the frequency difference between time pulse T on the one hand and the signals S1 and S3 on the other hand, the finer are the phase differences that can be detected by a single measurement. The present circuit was developed for use in an exchange. The frequency of the two signals S1 and S3 is around 4 kHz. The time pulse T is gained from an existing pulse of 10 MHz by means of a divider, which divides by the prime number 23. The resulting frequency of about 430 kHz is a good basis for further processing.

The inputs of the AND-gate 15 are connected to the outputs Q of flip-flops 11 and 12. The output signal of the AND-gate 15 is delayed by the delay stage 16, and forms an auxiliary signal S2, which is located at the reset inputs R of both flip-flops. The delay time of the delay stage 16 must be chosen at least long enough so that a counter, which is released once, remains open at least long enough to react to an existing clock pulse. In the very small phase differences being considered in this instance in particular, the time periods corresponding to these phase differences, which must be compared to the time pulse, are very short. They are even shorter than a single clock pulse. On the other hand, no complete pulse period must exist in a counter, so that the counter continues to count. Depending on the type, a counter reacts to a rising or falling slope of the time pulse. However, since on the one hand such a slope is not ideal (ramp-like transition instead of a jump), and on the other hand a counter requires a certain minimal reaction time, the delay stage 16 must provide a certain minimal release time for the counters. It must also be taken into consideration that the flip-flops 11 and 12, the AND-gate 15 and the counters 13 and 14 also contain certain minimal delays. The delay stage 16 may be a delay line, a shift register, a monoflop (one-shot multivibrator) or a series of inverters, and can possibly also be entirely omitted if the remaining delays are not insignificant.

A minimal release time that exceeds the minimum is not disturbing, in principle. That is why an auxiliary signal S2 can be used to reset the flip-flops 11 and 12, which, although it has the frequency of signals S1 and S3, has a different origin. In any event, it is important for the auxiliary signal S2 to be decoupled as far as possible from the signals S1 and S3 and from the time pulse T. For practical reasons, the minimal delay time should not be too long, because it reduces the measuring range and encumbers the counter unnecessarily with a kind of basic load.

In the above cited example for use in an exchange, in which the time pulse T has a frequency of about 430 kHz and the signals S1 and S3 a frequency of 4 kHz, a delay of 200 ns was chosen; the counters 13 and 14 are 16-bit binary counters, whose reaction time is around 50 ns.

The outputs of counters 13 and 14 are connected to the evaluation unit 17, making the status of the counters available to the latter. Evaluation unit 17 now evaluates the status of the counters in such a way, that it forms the difference, e.g. by means of a digital inverter and a digital adder, and makes it available as a digital output signal 0. This can occur after each individual measurement, for example by means of the auxiliary signal S2. Subsequently the evaluation unit 17 causes the resetting of counters 13 and 14. Instead of resetting the counters, the last counter status can be stored and subtracted from the next.

Preferably however, the evaluation unit 17 only produces an evaluation of the counter status after a number of measurements. To that effect, the auxiliary signal S2 can, for example, be divided by 100 by a divider. This would then lead to an average after 100 measurements. Insofar as the individual measurements are sufficiently decoupled with respect to each other, as indicated above, the result is a diminution of the measurement error to one hundredth. The division factor, as well as the ratio of the frequencies of the time pulse T and the signals 13 and 14 result in a very specific, very fine resolution of the measurement.

Figure 2:
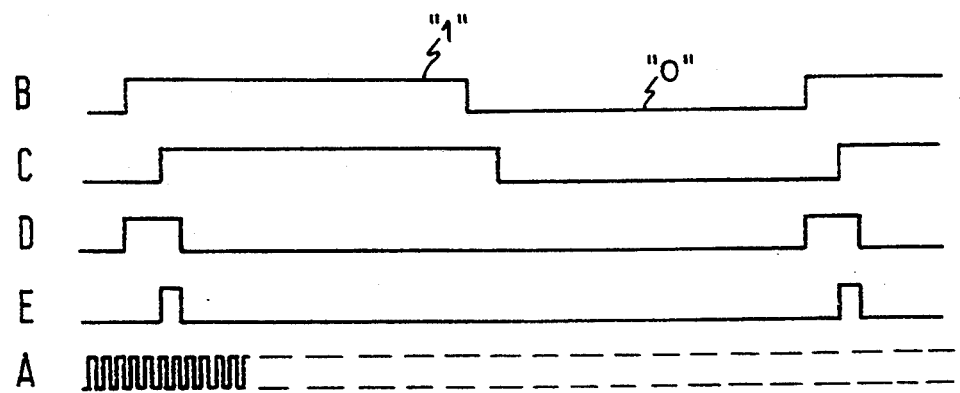
FIG. 2 shows time processes of the phase comparator in FIG. 1.

In the present example, the evaluation occurs every 100 ms by means of interrupt-control via a microprocessor. This produces a resolution of 5.8 ns. FIG. 2 explains the operating mode of the phase comparator in FIG. 1. Time processes A, B, C, D and E are shown.

B and C represent the signals S1 and S3 being compared, which are present at the pulse inputs S of flip-flops 11 or 12. D or E represent the signals at the corresponding outputs Q, which are used to release counters 13 or 14. In this instance A represents the time pulse T.

In the illustrated example, signal C lags with respect to signal B. The release signal D is therefore set earlier than release signal E. However, both are simultaneously reset (by the delay stage). In that way counter 13 is released for about four pulses of the time pulse, by contrast counter 14 is released for only about two pulses.

With 100 measurements, counter 13 now counts for example 54 times four pulses, otherwise (100-54) only three, and at the end exhibits a counter status of 354. By contrast, counter 14 counts 76 times two pulses during the same time interval, otherwise (100-76) only one, and at the end exhibits a counter status of 176. This example produces a difference of 178 and an average value of 1.78. The phase difference is therefore 1.78 times the cycle duration (period) of time pulse T.

Figure 3:
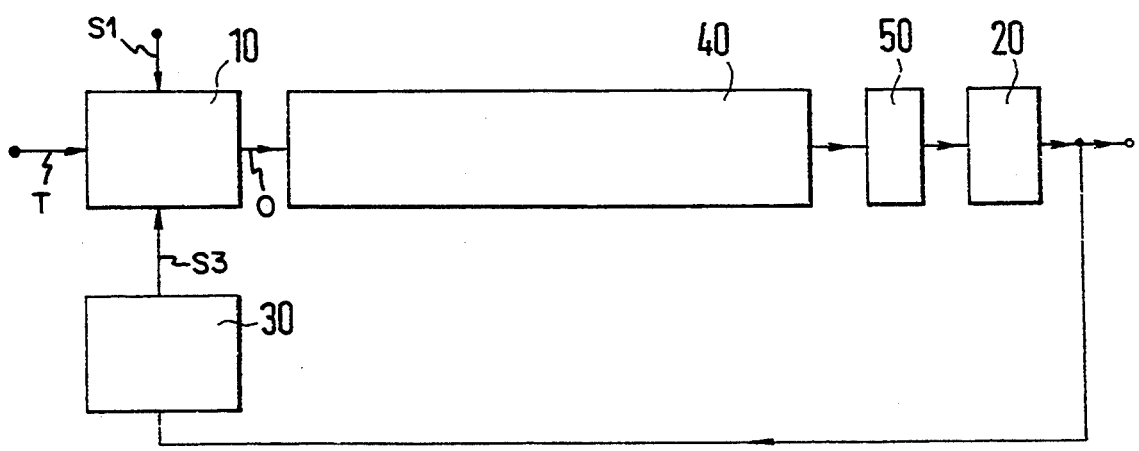
FIG. 3 is a phase-locked loop with a phase comparator according to FIG. 1.

FIG. 3 now describes a phase-locked loop, which contains a phase comparator 10 as described earlier. In addition to the phase comparator 10, the phase-locked loop contains a voltage-controlled oscillator 20, a divider 30, an open-loop control system 40 and a digital analog converter 50.

This is the usual arrangement of a phase-locked loop, except for the configuration specified by the invention and the digital analog converter required for the digital evaluation.

The size of the voltage-controlled oscillator 20 is appropriate for the desired nominal frequency. Its output signal, which is also emitted to the outside, is divided by divider 30 in such a way, that it can be compared to a reference frequency by the phase comparator 10. The open-loop control system 40 provides the desired control process. It contains a proportional branch with a multiplier, which determines the proportional control action, where the actual deviations are continuously controlled, and an integral branch, which determines the integration action, so that over the long term (in this instance with a time constant of several hundred to several thousand seconds), any remaining smaller deviations can be added and taken into consideration as well at the end. A differential part, which could quickly react to short-term deviations, is not provided in this case. The integral branch is a multiplier with a subsequent adder and register (index). The register returns the output value of the adder to its input, so that it is added to the output value of the multiplier of the integral branch. The output values of the proportional branch and the integral branch are added by another adder, and form the output value of the open-loop control system, which, after rendering them analog, readjusts the frequency and phase of the voltage-controlled oscillator in the known manner.

What is claimed is:

1. A digital phase comparator (10) comprising:
   a first flip-flop (11) which is settable by a given phase transition of a first signal (S1) and resettable by a given phase transition of a second signal (S2), and
   a first counter (13) which is enabled by the flip-flop (11) as long as the latter is set, and whose clock input (ck) is supplied with a clock signal (T) whose frequency is high compared with the frequencies of the first signal (S1) and the second signal (S2), characterized in that
   a second flip-flop (12) is provided which is settable by a given phase transition of a third signal (S3) and is resettable together with the first flip-flop (11) using the signal (S2),
   a second counter (14) is provided which is enabled by the second flip-flop (12) as long as the latter is set, and whose clock input (ck) is supplied with the clock signal (T),
   an evaluation unit (17) is provided which forms a reference value for the phase difference between the first signal (S1) and the third signal (S3) by calculating the difference between the counts of the two counters, and
   the second signal (S2) is an auxiliary signal generated by a delay stage (15, 16) and has a frequency that is substantially equal to the frequency of the first signal (S1) and the third signal (S3).

2. A phase comparator as claimed in claim 1, characterized in that the delay stage includes AND gate circuit means (15) and delay stage circuit means (16), responsive the signals at the two outputs of the first and second flip-flops (11, 12), for providing the second signal (S2).

3. A phase comparator as claimed in claim 1, characterized in that the evaluation unit (17) averages a series of phase differences between the first Signal (S1) and the third signal (S3).

4. A phase comparator as claimed in claim 1, characterized in that the evaluation unit (17) averages a series of phase differences.

5. A phase-locked loop with a digital phase comparator (10) comprising:
   a first flip-flop (11) which is settable by a given phase transition of a first signal (S1) and resettable by a given phase transition of a second signal (S2), and
   a first counter (13) which is enabled by the flip-flop (11) as long as the latter is set, and whose clock input (ck) is supplied with a clock signal (T) whose frequency is high compared with the frequencies of the first signal (S1) and the second signal (S2), characterized in that
   a second flip-flop (12) is provided which is settable by a given phase transition of a third signal (S3) and is resettable together with the first flip-flop (11) using the signal (S2),
   a second counter (14) is provided which is enabled by the second flip-flop (12) as long as the latter is set, and whose clock input (ck) is supplied with the clock signal (T),
   an evaluation unit (17) is provided which forms a reference value for the phase difference between the first signal (S1) and the third signal (S3) by calculating the difference between the counts of the two counters, and
   the second signal (S2) is an auxiliary signal generated by a delay stage (15, 16) and has a frequency that is substantially equal to the frequency of the first signal (S1) and the third signal (S3).

6. A digital phase comparator (10), comprising:
   first flip flop means (11), responsive to clock setting signals (S1) having first phase transitions, responsive to a first logical "1" data signal, and further responsive to resetting signals (S2) having second phase transitions, for providing first counter enable signals (Q11);
   second flip flop means (12), responsive to clock setting signals (S3) having third phase transitions, responsive to a second logical "1" data signal, and further responsive to the resetting signals (S2), for providing second counter enable signals (Q12);
   delay stage means (15, 16), responsive to the first counter enable signals (Q11), and further responsive to the second counter enable signals (Q12), for providing the resetting signals (S2);
   first counter means (13), responsive to the first counter enable signals (Q11), and further responsive to time pulse clock signals (T), for providing first counter output signals;
   second counter means (14), responsive to the second counter enable signals (Q12), and further responsive to the time pulse clock signals (T), for providing second counter output signals;
   evaluation circuit means (17), responsive to the first counter output signals, and further responsive to the second counter output signals, for providing reference value signal depending on the phase difference between the first clock setting signals (S1) and the third clock setting signals (S3).

7. A digital phase comparator (10) according to claim 6, wherein the delay stage means (16) includes an AND gate (15), responsive to the first counter enable signals (Q11), and further responsive to the second counter enable signals (Q12), for providing combined first and second counter enable signals (Q12).

8. A digital phase comparator (10) according to claim 7, wherein the delay stage means (16) also includes delay means (16), responsive to the combined first and second counter enable signals (Q12), for providing the resetting signals (S2).

* * * * *

UNITED STATES PATENT AND TRADEMARK OFFICE
CERTIFICATE OF CORRECTION

PATENT NO. : 5,432,826
DATED : July 11, 1995
INVENTOR(S) : Rieder

It is certified that error appears in the above-identified patent and that said Letters Patent is hereby corrected as shown below:

At column 5, lines 61-64 (claim), please delete claim 3 in its entirety, and insert --3. A phase comparator as claimed in claim 1, characterized in that the frequency of the clock signal (T) is not an integral multiple of the frequency of the first signal (S1) and the third signal (S3).--.

At column 5, lines 65-67 (claim), please delete claim 4 in its entirety, and insert --4. A phase comparator as claimed in claim 1, characterized in that the evaluation unit (17) averages a series of phase differences between the first signal (S1) and the third signal (S3).--.

Signed and Sealed this

Third Day of August, 1999

Q. TODD DICKINSON

Attest:

Attesting Officer

Acting Commissioner of Patents and Trademarks